United States Patent [19]
Huang

[11] Patent Number: 6,160,422
[45] Date of Patent: Dec. 12, 2000

[54] POWER SAVING CLOCK BUFFER

[75] Inventor: Ming-Huang Huang, Hsinchu Hsien, Taiwan

[73] Assignee: Silicon Integrated Systems Corp., Hsinchu, Taiwan

[21] Appl. No.: 09/304,398

[22] Filed: May 3, 1999

[51] Int. Cl.[7] .............................................. H03K 19/003
[52] U.S. Cl. ............................................ 326/95; 365/233
[58] Field of Search .................................. 365/233, 208, 365/226, 229; 326/95; 327/112

[56] References Cited

U.S. PATENT DOCUMENTS

| | | | |
|---|---|---|---|
| 5,087,841 | 2/1992 | Rogers | 307/475 |
| 5,452,434 | 9/1995 | MacDonald | 395/550 |
| 5,760,620 | 6/1998 | Doluca | 327/112 |

Primary Examiner—Viet Q. Nguyen
Assistant Examiner—Thong Le

[57] ABSTRACT

A power saving clock buffer comprises a first control stage installed between a clock output and a first switch stage for controlling the state of the first switch stage. A second switch stage installed between the clock output and a second switch stage for controlling the state of the second switch stage. A clock input stage is formed by connecting an PMOS with a NMOSs, and is installed between a clock input and the first and second switch stages and is connected to the clock output through a phase inverting logic circuit. By the aforementioned circuit structure, the clock circuit will stop working as the related circuit does not work and, therefore, the power is saved and a high reliability is attained.

6 Claims, 4 Drawing Sheets

| OUTHN | OUTL | CLKOUT |
|---|---|---|
| 0 | 0 | H |
| 0 | 1 | NOT ALLOWED |
| 1 | 0 | NORMAL OPERATION |
| 1 | 1 | L |

POWER SAVING CLOCK BUFFER

FIELD OF THE INVENTION

The present invention relates to a power saving clock buffer, especially to a clock circuit which stops working as the related circuit does not work, for saving power and achieving high reliability.

BACKGROUND OF THE INVENTION

In an integrated circuit, before supplying a clock signal to components, the clock signal will be buffered through clock buffers such that the clock signal becomes more steady. As shown in FIG. 6, a prior art clock buffer is disclosed. If it is desired to cause a circuit not to work, the general way is stop sending any signal to the circuit. For example, a counting circuit is formed by a plurality of flip-flops, each having a clock input and a data input. If it is desired to stop the action of the counting circuit, the conventional way is stop sending any data signal to the circuit, while still sending clock signal to the flip-flops. Although the circuit does not perform counting function, the flip-flops still receive clock signals. Therefore, clock buffers and flip-flops still consume power and this power consumption increases as the gate count and working frequency increase. As a consequence, the cost is increased and the reliability reduces.

SUMMARY OF THE INVENTION

Accordingly, the present invention has been made to overcome the above-mentioned problems.

The primary object of the present invention is to provide a power saving clock buffer, wherein two control signals are used to control the clock output of a buffer. In the proposed clock buffer, as the circuit does not work, the clock signal outputted can be kept in either high or low level by properly selecting the state of both control signals so that the related circuit can not receive both data and clock signals, and thus gets into a complete stop condition. No power will be consumed by the clock buffers and the related circuit in this condition.

The various objects and advantages of the present invention will be more readily understood from the following detailed description and the accompany drawings.

DETAILED DESCRIPTION OF THE PREFERRED EMBODIMENTS

Figure 1:
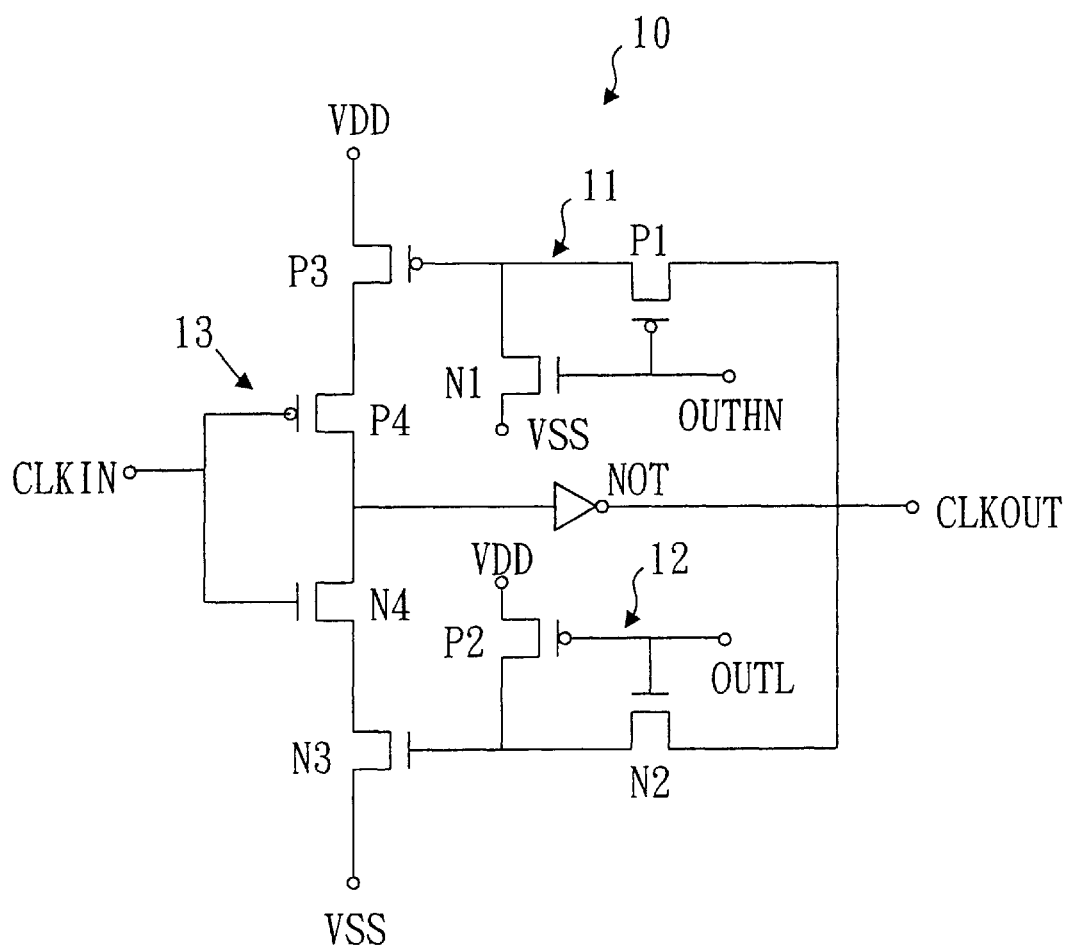
FIG. 1 is the circuit of the present invention.

With reference now to FIG. 1, the circuit diagram of the clock buffer of the present invention is disclosed. The buffer clock 10 includes a first control stage 11, a second control stage 12, a first switch stage P3, a second switch stage N3, and a clock input stage 13.

The first control stage 11 is formed by connecting a PMOS (P1) between the gate of the first switch stages P3 and the clock output CLKOUT and an NMOS (N1) between the gate of the first switch stage P3 and the power source VSS. The two parallelly connected gates of P1 and N1 are connected to the first control signal OUTHN.

The second control stage 12 is formed by connecting an NMOS (N2) between the gate of the second switch stage N3 and the clock output CLKOUT, and a PMOS (P2) between the gate of the second switch stage N3 and the power source VDD. The two parallelly connected stages of N2 and P2 are connected to the second control signal OUTL.

The first switch stage P3 is a PMOS in this embodiment and is connected between the power source VDD and the clock input stage 13 determined by the conduction of the first control stage 11.

The second switch stage N3 is an NMOS in this embodiment and is connected between a power source VSS and the clock input stage 13 determined by the conduction of the second control stage 12.

The clock input stage 13 is formed by connecting one end of a PMOS (P4) and one end of an NMOS (N4) together as output of this stage. The other end of P4 is connected to the first switch stage P3 and the other end of N4 is connected to the second switch stage N3. The output of the clock input stage 13 is connected to the clock output CLKOUT through a gate with an equivalent NOT function.

Figures 4, 5:
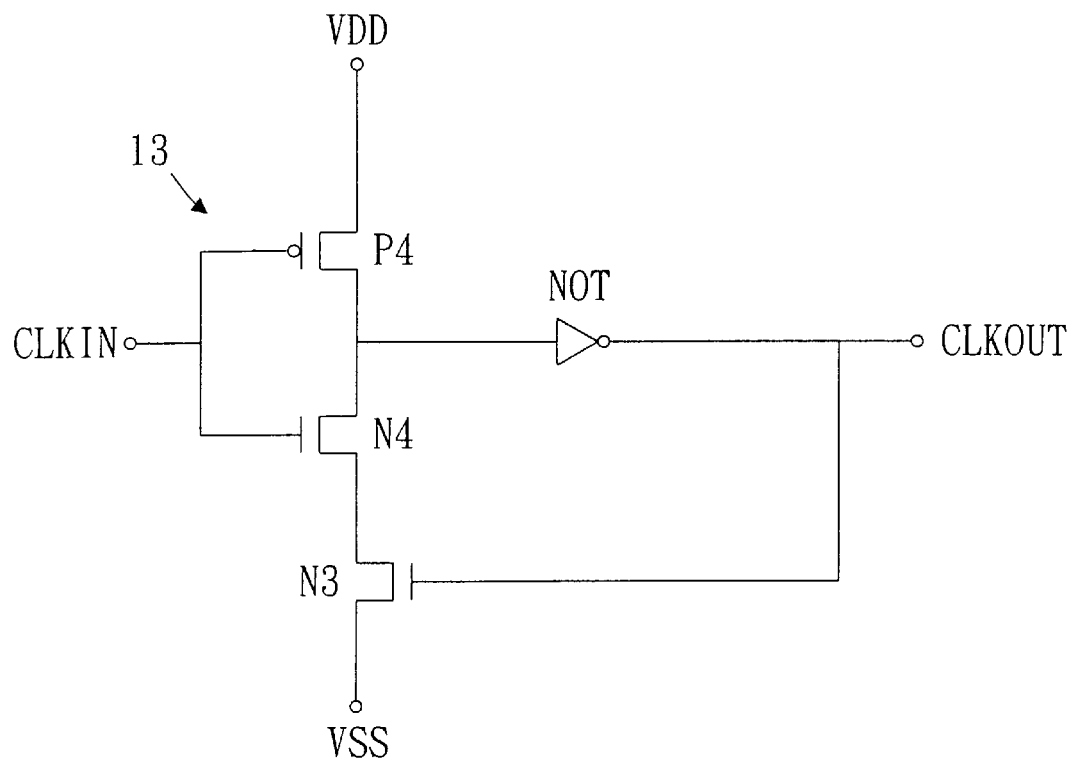
FIG. 4 shows an equivalent circuit of FIG. 1, wherein the control signal OUTHN is 1 and OUTL is 1.
FIG. 5 is the truth table of the circuit shown in FIG. 1.
Figure 6:
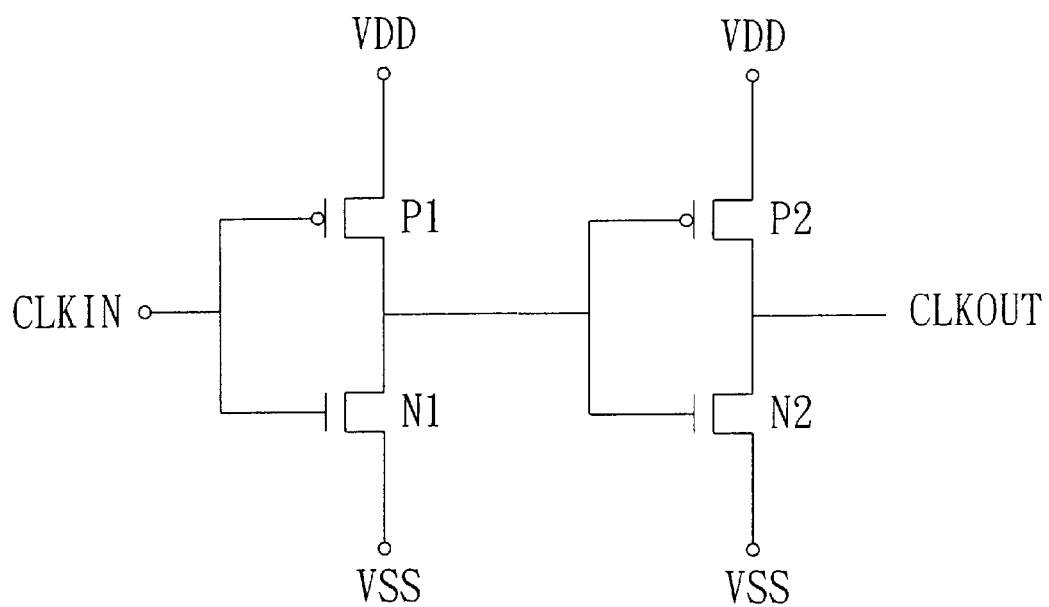
FIG. 6 shows the circuit of a conventional clock buffer.

The aforesaid control signals OUTHN and OUTL are controlled by other circuit (depending on the assembled circuit, which may be a chip, a CPU, etc.). Two control signals result in four states (as shown in FIG. 5) whose conditions are further described in the following.

Figure 2:
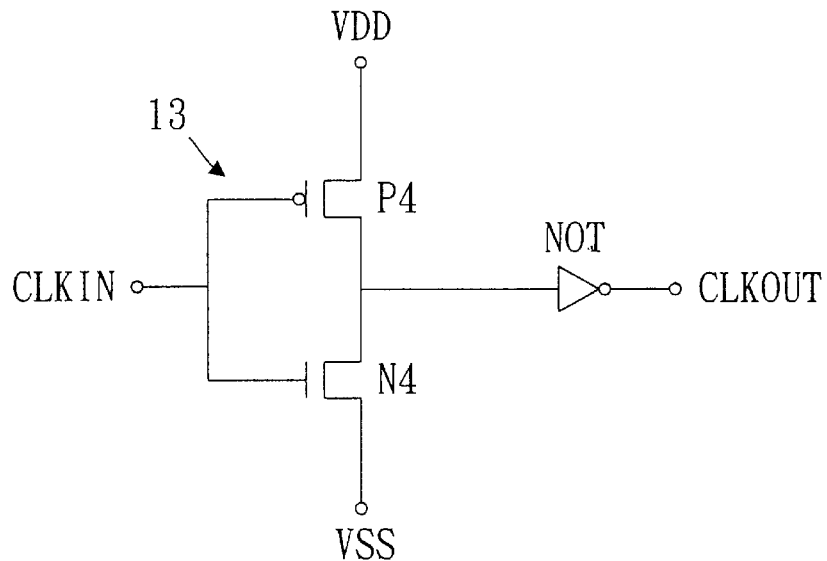
FIG. 2 shows an equivalent circuit of FIG. 1, wherein the control signal OUTHN is 1 and OUTL is 0.

When the control signal OUTHN is connected to the HIGH logic state ("1"), the control signal OUTL is connected to the power source VSS, P1 of first control stage 11 turns off (OFF), and N1 is conductive (ON) so that the first switch stage P3 is conductive. P2 of the second control stage conducts and N2 turns OFF so that the second control stage N3 is conductive. The functional equivalent circuit is re-drawn as in FIG. 2. P4 and N4 of the clock input stage 13 resemble an equivalent circuit of a NOT gate. The phase of the clock input signal from the clock input CLKIN is inverted and then further inverted by an equivalent NOT function, thus an identical phase and buffered clock output signal is obtained. In this control signals' state, the proposed clock buffer is in a normal working state with an equivalent function as a general clock buffer.

Figure 3:
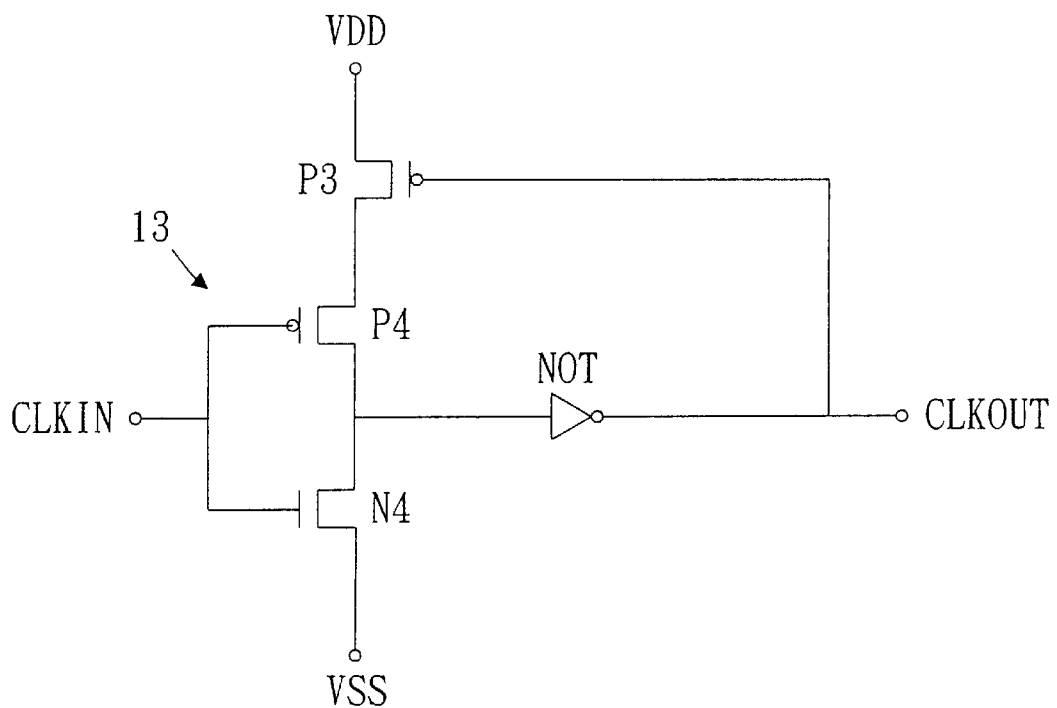
FIG. 3 shows an equivalent circuit of FIG. 1, wherein the control signal OUTHN is 0 and OUTL is 0.

When both the control signals OUTHN and OUTL are connected to the "LOW" logic state, P1 of the first control stage 11 is conductive and N1 turns off. The P2 of second control stage 12 conducts, and N2 turns off so that the second switch stage N2 is conductive. The functional equivalent circuit thereof is shown in FIG. 3. The clock input CLKIN is a continuous clock input. Once the clock output CLKOUT goes high, the first switch stage P3 turns off so that the output of the clock input stage can only pull low. Consequently in this control signals' state, the clock output CLKOUT of the proposed clock buffer can only output "HIGH", and thus no power will be consumed by the clock buffers and the related circuit.

When both the control signal OUTHN and OUTL are connected to the "High" logic state ("1"), P1 of the first control stage 11 turns off, and N1 conducts so that the first switch stage P3 is conductive. P2 of the second control stage turns off and N2 conducts. The functional equivalent circuit is re-drawn as in FIG. 4. The clock input CLKIN is a continuous clock input. Once the clock output CLKOUT goes low, the second switch stage N3 turns off so that the output of the clock input stage can only pull high. Consequently in this control signals' state, the clock output CLKOUT of the proposed clock buffer can only output "LOW", and thus no power will be consumed by the clock buffers and the related circuit.

Therefore, when the circuit does not work, both of the control signals OUTHN and OUTL can be connected to logic high ("1") or logic low ("0"), then the clock output is retained in LOW or HIGH, and other connected related circuits can not receive the related signal. Therefore, a real idle state is attained and the power is saved. Moreover, since P1 of the first control stage is connected between the gate of the first switch stage P3 and the clock output CLKOUT, and N2 of the second control stage N2 is connected between the gate of the second switch stage N3 and the clock output CLKOUT to form a feedback loop. When the circuit is transferred into a state only outputting "HIGH" or "LOW" from a normal working state, this circuit will sample the state of the clock output, and it will not output a tip wave.

Moreover, it is appreciated that when the control signal OUTHN is connected to logic "LOW" ("0") and the OUTL is connected to logic "HIGH" ("1"), a racing state will be induced. For the purpose of preventing racing condition, it can be controlled by the control circuit of the output control signals OUTHN and OUTL to prevent this condition.

In summary, by means of power saving clock buffer of the present invention, through the control signal state, the output of the buffer is retained in "HIGH" or "LOW", so that other circuits no longer receive continuous clock signals, and stop working completely. The power is saved. This effect is more significant as in a chip having many logic gates and consuming much power.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A power saving clock buffer comprising:
   a clock input stage having a first node, a second node and an output node;
   an inverter having an input node connected to the output node of said clock input stage, and an output node for outputting a clock output for said power saving clock buffer;
   a first switch stage connecting the first node of said clock input stage to a first power source, said first switch stage having a gate;
   a second switch stage connecting the second node of said clock input stage to a second power source, said second switch having a gate;
   a first control stage having a first node connected to the gate of said first switch stage, a second node connected to said second power source, a third node connected to the output node of said inverter, and a control node; and
   a second control stage having a first node connected to the gate of said second switch stage, a second node connected to said first power source, a third node connected to the output node of said inverter, and a control node.

2. The power saving clock buffer as claimed in claim 1, said first control stage comprising:
   an NMOS connecting the first and the second nodes of said first control stage, said NMOS having a gate; and
   a PMOS connecting the first and the third nodes of said first control stage, said PMOS having a gate;
   wherein the gate of said NMOS and the gate of said PMOS are connected to the control node of said first control stage.

3. The power saving clock buffer as claimed in claim 1, said second control stage comprising:
   a PMOS connecting the first and the second nodes of said second control stage, said PMOS having a gate; and
   an NMOS connecting the first and the third nodes of said second control stage, said NMOS having a gate;
   wherein the gate of said PMOS and the gate of said NMOS are connected to the control node of said second control stage.

4. The power saving clock buffer as claimed in claim 1, said first switch stage being a PMOS and said second stage being an NMOS.

5. The power saving clock buffer as claimed in claim 1, said clock input stage having a PMOS connected between the first node and the output node of said clock input stage, and an NMOS connected between the second node and the output node of said clock input stage.

6. A power saving clock buffer comprising:
   a clock input stage having a first node, a second node, an output node, a PMOS connecting said first node and said output node, and an NMOS connecting said second node and said output node;
   an inverter having an input node connected to the output node of said clock input stage, and an output node for outputting a clock output for said power saving clock buffer;
   a first switch PMOS connecting the first node of said clock input stage to a first power source, said first switch PMOS having a gate;
   a second switch NMOS connecting the second node of said clock input stage to a second power source, said second switch NMOS having a gate;
   a first control stage having a first control NMOS connecting the gate of said first switch PMOS to said second power source, a first control PMOS connecting the gate of said first switch PMOS to the output node of said inverter, and a control node being connected to a gate of the first control NMOS as well as a gate of the first control PMOS; and
   a second control stage having a second control PMOS connecting the gate of said second switch NMOS to said first power source, and a second control NMOS connecting the gate of said second switch NMOS to the output node of said inverter, and a control node being connected to a gate of the second control PMOS as well as a gate of the second control NMOS.

* * * * *